(12) United States Patent
Anderson et al.

(10) Patent No.: US 7,374,980 B2
(45) Date of Patent: May 20, 2008

(54) FIELD EFFECT TRANSISTOR WITH THIN GATE ELECTRODE AND METHOD OF FABRICATING SAME

(75) Inventors: Brent Alan Anderson, Jericho, VT (US); Andres Bryant, Burlington, VT (US); William F. Clark, Jr., Essex Junction, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 11/549,311

(22) Filed: Oct. 13, 2006

(65) Prior Publication Data

US 2008/0090367 A1    Apr. 17, 2008

(51) Int. Cl.
  *H01L 21/84*  (2006.01)
  *H01L 21/8242* (2006.01)

(52) U.S. Cl. ............... 438/153; 438/154; 438/241; 438/258; 438/199; 438/301; 257/E21.4; 257/E21.404; 257/E21.382

(58) Field of Classification Search ........ 438/153–154, 438/241, 258, 199, 300–301; 257/E21.4, 257/E21.404, E21.382
See application file for complete search history.

(56) References Cited

U.S. PATENT DOCUMENTS

| | | | |
|---|---|---|---|
| 5,989,946 A * | 11/1999 | Honeycutt | ........... 438/153 |
| 6,395,606 B1 | 5/2002 | Huster et al. | |
| 6,437,390 B1 | 8/2002 | Thapar | |
| 7,015,126 B2 | 3/2006 | Wu et al. | |
| 7,033,868 B2 | 4/2006 | Nakamura et al. | |
| 7,045,456 B2 | 5/2006 | Murto et al. | |
| 7,074,660 B2 * | 7/2006 | Manger | ........... 438/197 |
| 7,135,401 B2 * | 11/2006 | Tran et al. | ........... 438/637 |
| 7,273,785 B2 * | 9/2007 | Dennard et al. | ........... 438/262 |
| 2005/0156238 A1 | 7/2005 | Wen et al. | |
| 2006/0068556 A1 | 3/2006 | Noda | |
| 2006/0102962 A1 | 5/2006 | Saito | |
| 2007/0092990 A1 * | 4/2007 | Belyansky et al. | ........ 438/106 |

* cited by examiner

Primary Examiner—Michael S. Lebentritt
Assistant Examiner—Mohsen Ahmadi
(74) Attorney, Agent, or Firm—Schmeiser, Olsen & Watts; William D. Sabo

(57) ABSTRACT

A field effect transistor and a method of fabricating the field effect transistor. The field effect transistor includes: a silicon body, a perimeter of the silicon body abutting a dielectric isolation; a source and a drain formed in the body and on opposite sides of a channel formed in the body; and a gate dielectric layer between the body and an electrically conductive gate electrode, a bottom surface of the gate dielectric layer in direct physical contact with a top surface of the body and a bottom surface the gate electrode in direct physical contact with a top surface of the gate dielectric layer, the gate electrode having a first region having a first thickness and a second region having a second thickness, the first region extending along the top surface of the gate dielectric layer over the channel region, the second thickness greater than the first thickness.

16 Claims, 7 Drawing Sheets

FIELD EFFECT TRANSISTOR WITH THIN GATE ELECTRODE AND METHOD OF FABRICATING SAME

FIELD OF THE INVENTION

The present invention relates to the field of semiconductor devices; more specifically, it relates to a field effect transistor having a thin gate electrode and a method for fabricating the field effect transistor.

BACKGROUND OF THE INVENTION

As the field effect transistors (FETs) used in integrated circuits become ever smaller, it has been found that many parameters do not decrease (or scale) as the physical dimensions of the FET decrease. One of these parameters is the fringe capacitance between the source/drains of the FET and the gate electrode. As capacitance increases, FETs slow down. Since fringe capacitance does not scale, smaller FETs do not exhibit as much increase in speed as expected. Thus, to achieve continuing performance gain with decreasing FET dimensions there is a need for FET structures having reduced fringe capacitance.

SUMMARY OF THE INVENTION

A first aspect of the present invention is a field effect transistor, comprising: a silicon body, a perimeter of the silicon body abutting a dielectric isolation; a source and a drain formed in the body and on opposite sides of a channel formed in the body; and a gate dielectric layer between the body and an electrically conductive gate electrode, a bottom surface of the gate dielectric layer in direct physical contact with a top surface of the body and a bottom surface the gate electrode in direct physical contact with a top surface of the gate dielectric layer, the gate electrode having a first region having a first thickness and a second region having a second thickness, the first region extending along the top surface of the gate dielectric layer over the channel region, the second thickness greater than the first thickness.

A second aspect of the present invention is a method of fabricating a field effect transistor, comprising: forming a dielectric isolation along a perimeter of a region of a silicon layer to define a silicon body in the silicon layer; forming a gate dielectric layer in direct physical contact with a top surface of the silicon body; forming a gate dielectric layer on the silicon body, a bottom surface of the gate dielectric layer in direct physical contact with a top surface of the silicon body; and forming an electrically conductive gate electrode on the gate dielectric layer, bottom surface of the gate electrode in direct physical contact with a top surface of the gate dielectric layer, the gate electrode having a first region having a first thickness and a second region having a second thickness, the first region extending along the top surface of the gate dielectric layer over the channel region, the second thickness greater than the first thickness.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

All etch steps described infra, unless otherwise noted, may be performed using a reactive ion retch (RIE) process.

Figure 1:
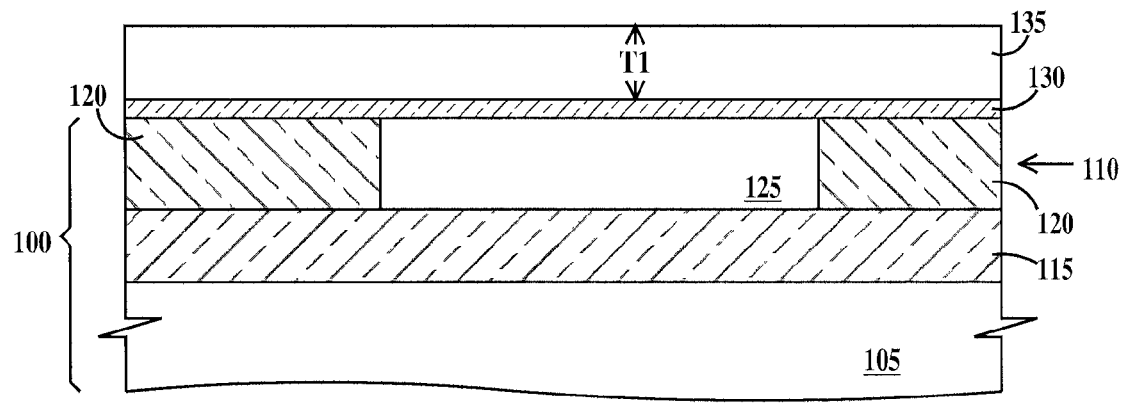
FIGS. 1 through 7 are cross-sectional drawings illustrating fabrication of an FET according to a first embodiment of the present invention.

FIGS. 1 through 7 are cross-sectional drawings illustrating fabrication of an FET according to a first embodiment of the present invention. In FIG. 1, a silicon-on-insulator (SOI) substrate includes a lower silicon layer 105, a single-crystal upper silicon layer 110 and a buried oxide layer (BOX) 115 between the upper and lower silicon layers. Formed in upper silicon layer 110 is a shallow trench isolation 120 surrounding a single-crystal silicon body region 125. Formed on a top surface SOI substrate 100 is a gate dielectric layer 130. Formed on a top surface of gate dielectric layer 130 is a polysilicon layer 135.

Polysilicon layer 135 has a thickness of T1. In one example T1 is between about 20 nm and about 100 nm. In one example gate dielectric layer 130 is silicon dioxide (Oxidized silicon), silicon nitride ($Si_3N_4$), silicon oxynitride ($SiO_YN_X$) or combinations of layers thereof. In one example, gate dielectric layer 130 is a high K (dielectric constant) material, examples of which include, but are not limited to, metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above about 10. In one example, gate dielectric layer 130 is about 0.5 nm to 20 nm thick.

Figure 2:
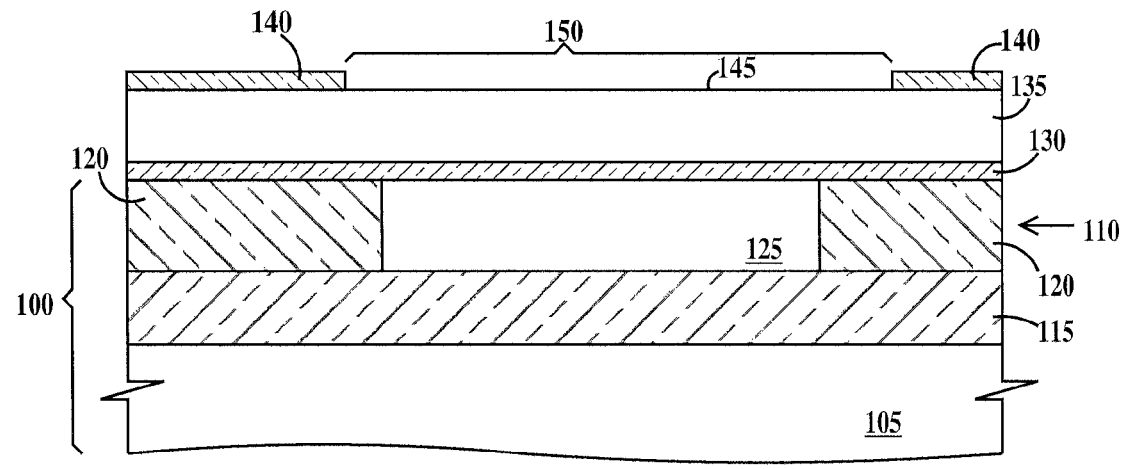

In FIG. 2, a hardmask layer 140 is formed on top surface 145 of polysilicon layer 135 and an opening 150 formed in the hardmask layer exposing the top surface of the polysilicon layer. In one example, hardmask layer 140 is $Si_3N_4$.

Figure 3:
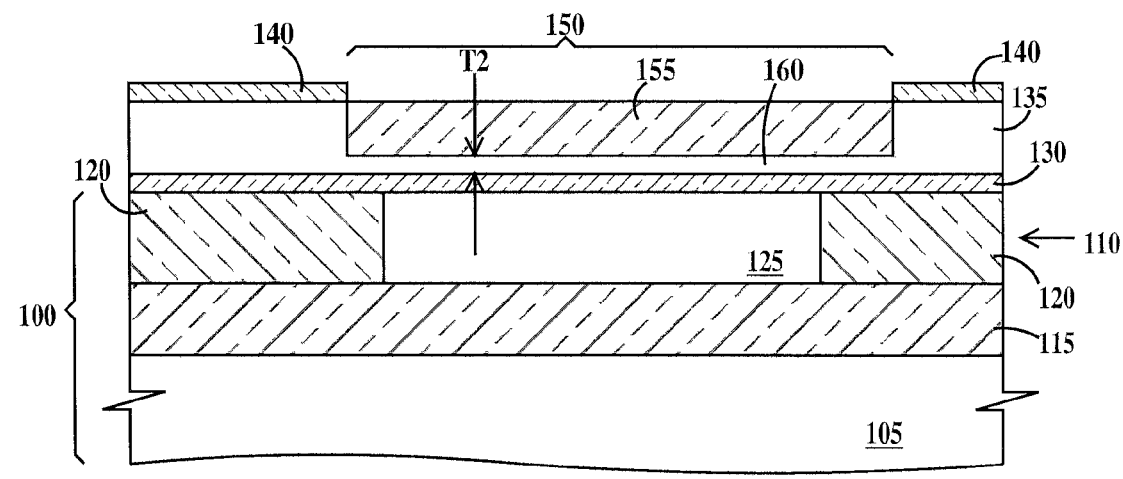

In FIG. 3, an oxidation of silicon layer 135 is performed to form a Oxidized silicon region 155 in opening 150. The oxidation is controlled so as not consume all the polysilicon in opening 150, but leave a thin polysilicon layer 160 over gate dielectric layer 130. In one example T2 is less than or equal to about 50 nm. In one example, T2 is less than or equal to about 30 nm.

Figure 4:
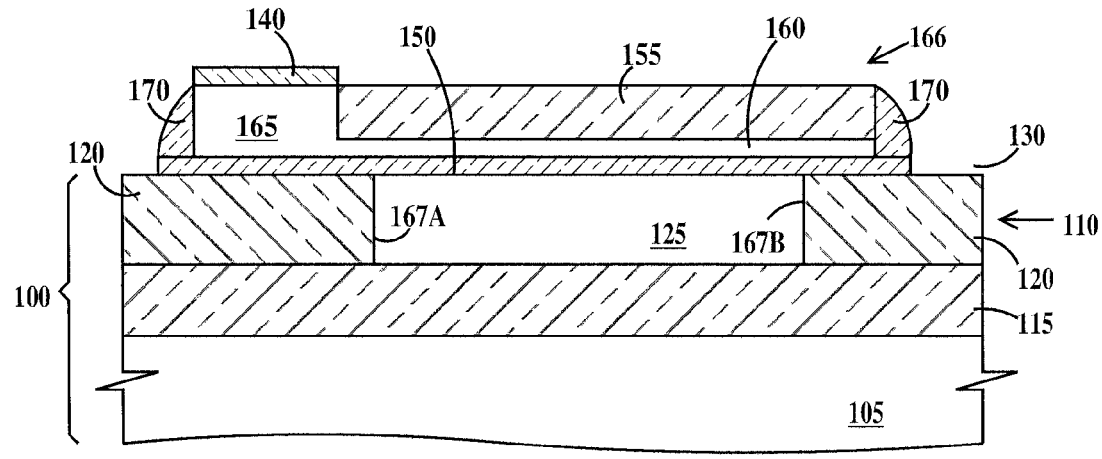

In FIG. 4, polysilicon layer 135 (see FIG. 3) and dielectric layer 140 are masked (using conventional photolithography to form a patterned photoresist mask) and then polysilicon layer 135 and dielectric layer 140, but not gate dielectric layer 130, are etched where not protected by the photoresist mask to define a first gate electrode precursor structure 166 comprising a thick polysilicon region 165, thin polysilicon layer 160 and Oxidized silicon region 155. Gate electrode precursor structure 166 that will define the lateral extents of the gate electrode of the FET being fabricated. A lateral direction is any direction parallel to top surface 150. Thin polysilicon layer 160 completely overlaps STI 120 over a first pair of opposite sidewalls (sidewalls 167A and 167B) of body 125 but does not completely overlap STI 120 over a second pair of opposite sidewalls of body 125 (not shown in FIG. 4). The first and second pairs of sidewalls are mutually perpendicular. Between each sidewall of the second pair of sidewalls and corresponding opposite sides of thin polysilicon layer 160 exist regions of body 125 not covered by thin polysilicon layer 160 and Oxidized silicon region 155. It is in these regions of body 125 that the source/drains of the FET being fabricated will be formed.

After the masking and etching, the photoresist mask is removed and spacers 170 are formed on the sidewalls of first gate electrode precursor structure 166 and source/drain ion implantations performed into regions of body 125 not protected by spacers 170, or first gate electrode precursor structure 166. Spacers 170 may be formed by deposition of a conformal material flowed by a directional RIE process. Spacers 170 consist of a dielectric material. Spacers 170 may comprise multiple independently formed spacers and multiple source/drain ion implantation steps may be performed, including source/drain extension implants and halo implants as commonly known in the art.

Next, regions of gate dielectric layer 130 not protected by spacers 170 or first gate electrode precursor structure 166 are removed and a metal silicide layer formed on the source drains. In one example, the silicide layer comprises Pt, Ti, Co or Ni silicide. Metal silicides may be formed, by blanket deposition of a thin metal layer followed by heating to a temperature sufficient to cause a chemical reaction between the metal and any silicon layer in contact with the metal, followed by RIE or wet etching to remove any unreacted metal.

Figure 5:
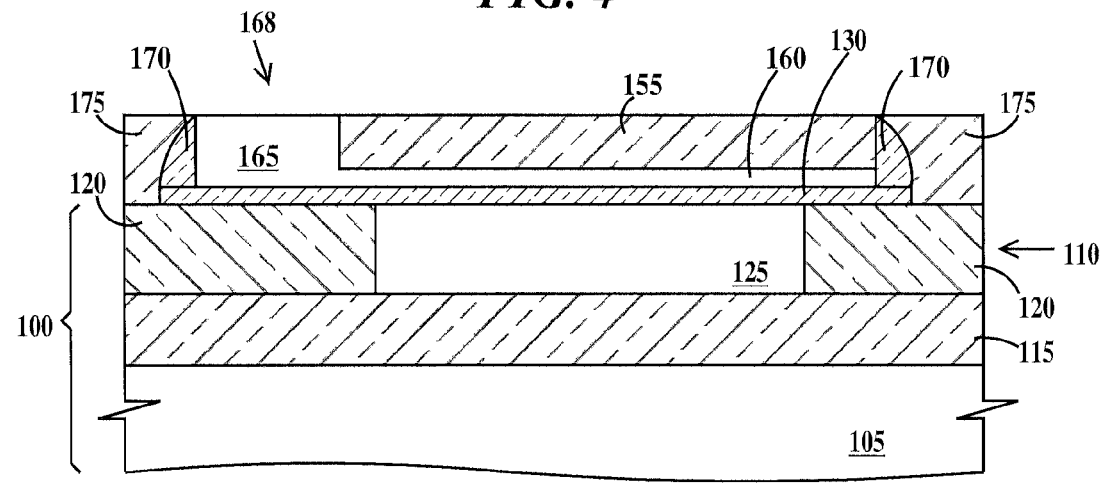

In FIG. 5, a dielectric layer 175 is formed over spacers 175, first gate electrode precursor structure 166 and exposed regions of substrate 100 and STI 120. Then a chemical-mechanical-polish (CMP) is performed to expose first gate electrode precursor structure 166 using hardmask layer 140 (see FIG. 4) as a polish stop. Next any remaining hardmask layer 140 is removed, by RIE or wet etching. In one example dielectric layer 175 comprises silicon dioxide (Oxidized silicon), silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$) or NBLok (SiC(N,H)) or combinations of layers thereof.

Figure 6:
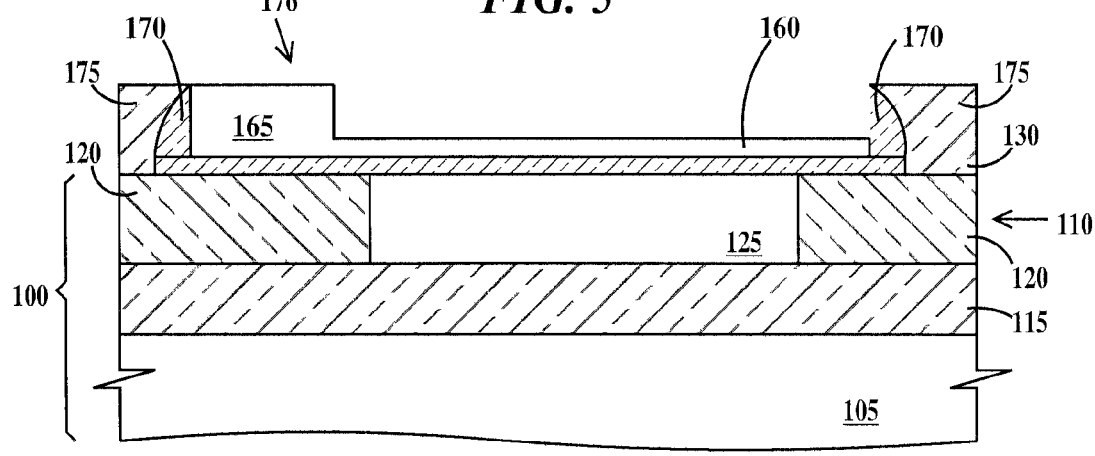

In FIG. 6, Oxidized silicon region 155 (see FIG. 5) is removed by RIE or wet etching to form a second gate electrode precursor structure 176 comprising thick polysilicon region 165 and thin polysilicon layer 160.

Figure 7:
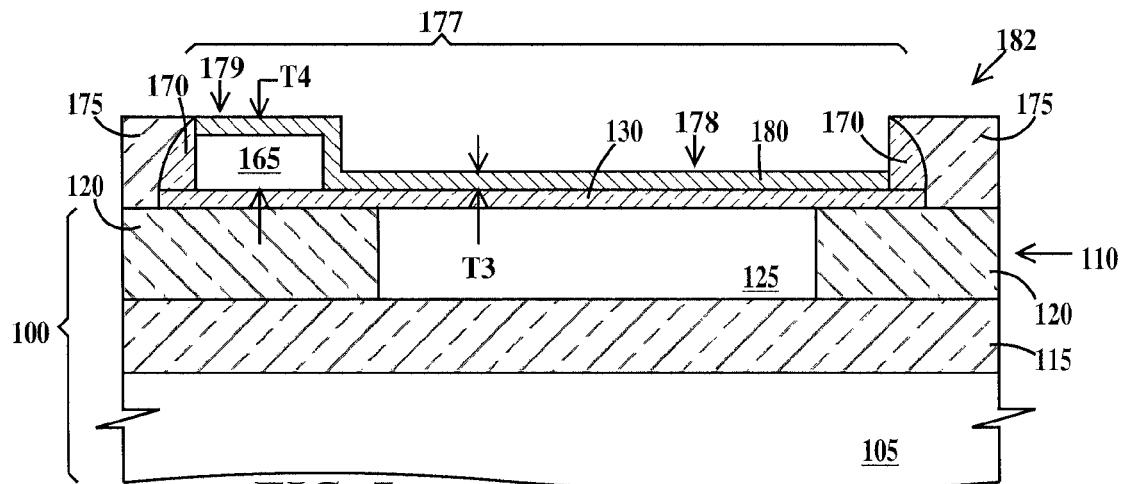
Figure 8A:
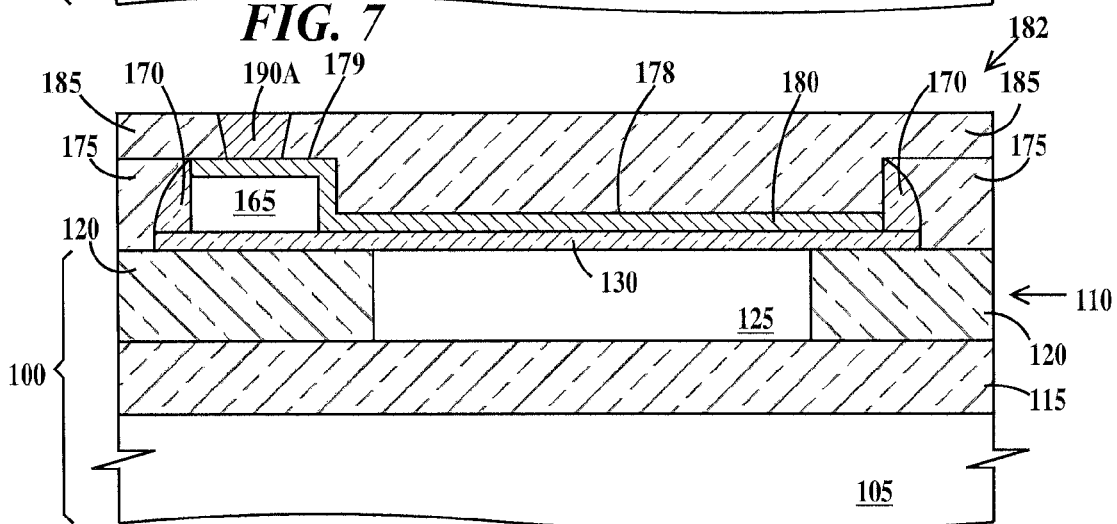
FIG. 8A is a cross-section through line 8A-8A of FIG. 8B which is a top view of the FET of FIGS. 1 through 7 after a further fabrication step.

In FIG. 7, a gate electrode 177 is formed. Gate electrode 177 comprises a continuous metal silicide layer 180 and thick polysilicon region 165. Thin polysilicon layer 160 (see FIG. 6) has been totally consumed by the metal silicide formation process. A thin gate electrode region 178 of gate electrode 177 comprises a first region of metal silicide layer 180 in direct physical contact with gate dielectric layer 130 over body 125. A raised gate electrode region 179 of gate electrode 177 comprises a second region of metal silicide layer 180 in direct contact with thick polysilicon region 165. In one example, silicide layer 180 comprises Pt, Ti, Co or Ni silicide. Raised contact region 179 provides a surface higher than thin gate electrode region 178 (relative to the top surface of gate dielectric layer 130) in order to land a gate contact as illustrated in FIG. 8A and described infra. This prevents breakthrough of the gate contact into gate dielectric layer 130.

Silicide layer 180 and thus thin gate electrode region 178 of gate electrode 177 has a thickness of T3 and raised gate electrode region 179 of gate electrode 177 has a thickness T4. In one example T3 is less than or equal to about 40 nm. In one example, T3 is less than or equal to about 20 nm. T4 is always greater than T3. In one example T4 is greater than or equal to about twice T3. Except for gate and source drain contacts; fabrication of an FET 182 is essentially complete.

Figure 8B:
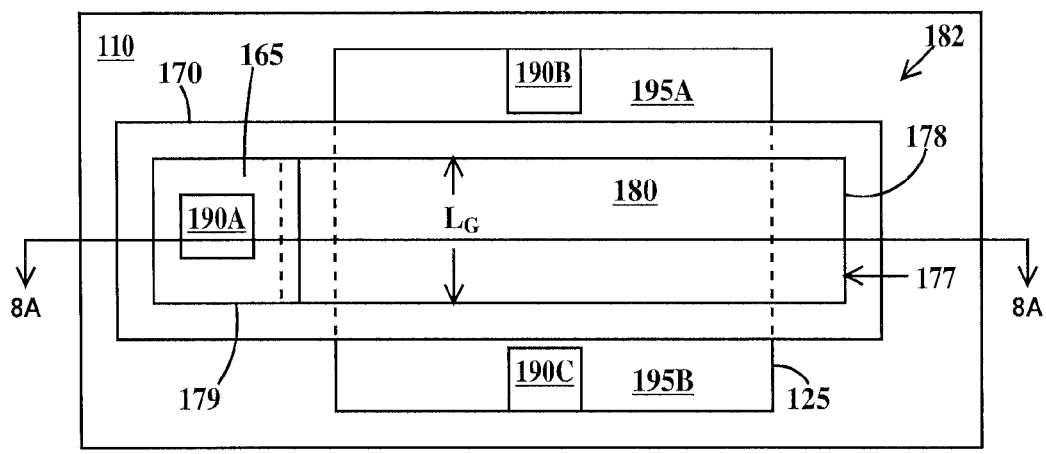

FIG. 8A is a cross-section through line 8A-8A of FIG. 8B, which is a top view of the FET of FIGS. 1 through 7 after a further fabrication step. In FIG. 8A, a dielectric layer 185 is formed over dielectric layer 175 and FET 182 and a CMP performed to planarize dielectric layer 175. In one example gate dielectric layer 175 comprises Oxidized silicon, $Si_3N_4$, $SiO_yN_x$, a low K (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$, or $SiC_xO_yH_y$, or SiOCH) manufactured by Applied Materials, Santa Clara, Calif., organosilicate glass (SiCOH), and porous SiCOH and combinations of layers thereof. A low K dielectric material has a relative permittivity of about 2.4 or less. In one example, dielectric layer 175 is between about 300 nm and about 2,000 nm thick.

Next an electrically conductive gate contact 190A is formed from a top surface of dielectric layer down to at least metal silicide layer 180 over thick polysilicon region 165, for example, by a damascene process. In one example, contact 190A comprises W, Ta, tantalum nitride (TaN), Ti, titanium nitride (TiN) or combinations of layers thereof. Gate contact 190A may extend into or through metal silicide layer 180 into thick polysilicon layer 165. Advantageously, there is no gate contact to thin gate electrode region 178, only a gate contact to raised gate electrode region 179. In FIG. 8B, dielectric layers 175 and 185 are omitted for clarity. In FIG. 8B, source/drains 195A and 195B are formed on either side of gate electrode 177 and contacts 190A and 190B (similar to contact 190A) are formed to source/drains 195A and 195B. FET 182 thus fabricated has a gate channel length $L_G$ defined by the width of gate electrode 177 between source/drains 195A and 195B. There is also a physical channel length $L_{PHYSICAL}$ that is defined as the distance between source/drains 195A and 195B. $L_G$ is greater than or equal to $L_{PHYSICAL}$ and depends upon how far source/drains 195A and 195B extend under gate electrode 177. In one example, (referring back to FIG. 7) T3 divided by $L_G$ is less than or equal to 1. In one example, $L_G$ is equal to or greater than about 4 times T3. In one example, (referring back to FIG. 7) T3 divided by $L_{PHYSICAL}$ s less than or equal to 1. In one example, $L_{PHYSICAL}$ is equal to or greater than about 4 times T3.

In FIGS. 8A and 8B, raised gate electrode region 179 is completely formed over STI 120 and no portion of raised gate electrode region 179 overlaps body 125. Only thin gate electrode region 178 extends over body 125. The fringe capacitance is thus reduced because of thinness of thin gate electrode region 178 over body 125 of FET 182 compared to conventional FETs where a thick polysilicon layer would extend out over the silicon body of the conventional FET.

Figure 9A:
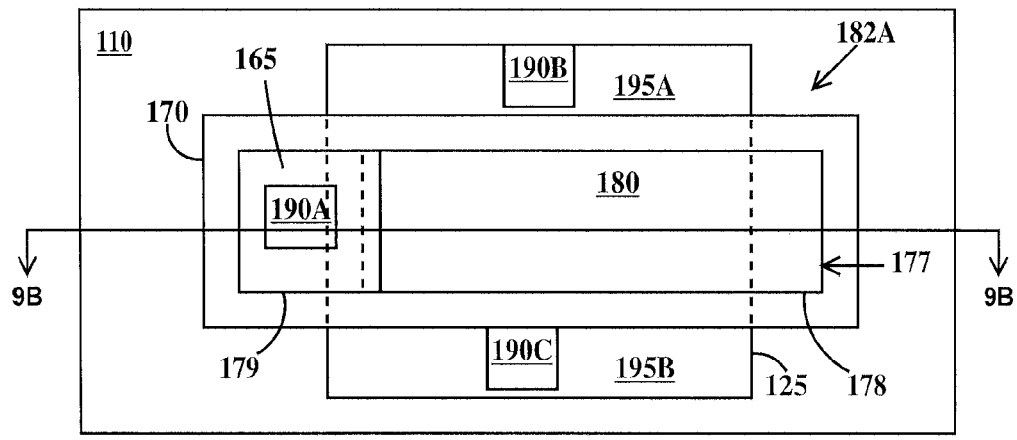
FIG. 9A is a top view and FIG. 9B is a cross-section through line 9B-9B of FIG. 9A of first alternative layout of an FET according to the first embodiment of the present invention.
Figure 9B:
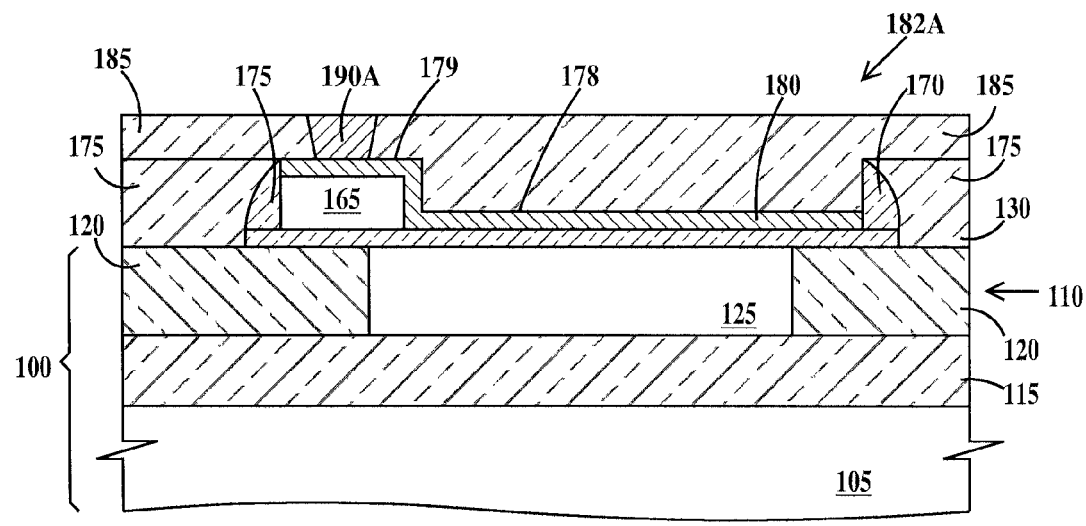

FIG. 9A is a top view and FIG. 9B is a cross-section through line 9B-9B of FIG. 9A of first alternative layout of an FET according to the first embodiment of the present invention. FIG. 9A is similar to FIG. 8B and FIG. 9B is similar to FIG. 8A except that a region of raised gate electrode region 179 of an FET 182A overlaps STI 120 and body 125. This still results in reduced fringe capacitance compared to a conventional FET and allows a reduction is area of FET 182A compared to FET 182 of FIGS. 8A and 8B.

Figure 10A:
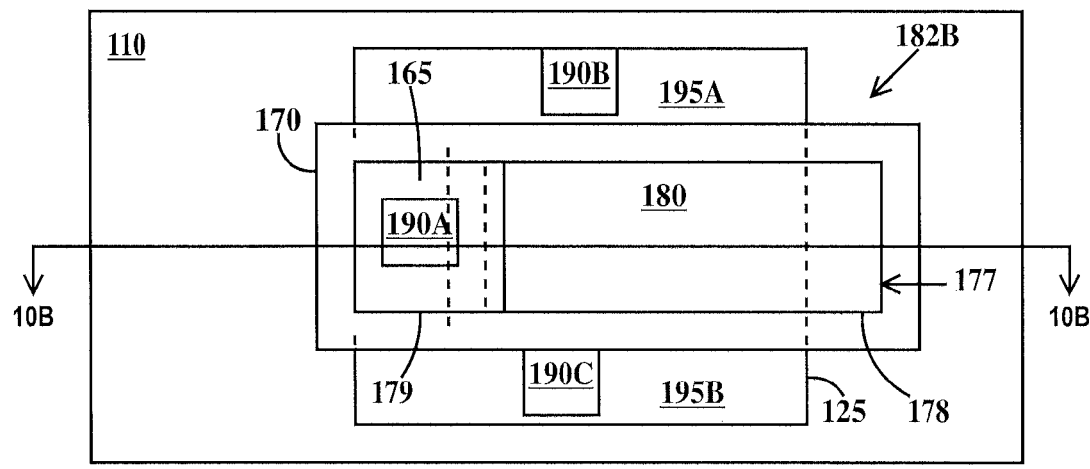
FIG. 10A is a top view and FIG. 10B is a cross-section through line 10B-10B of FIG. 10A of second alternative layout of an FET according to the first embodiment of the present invention.
Figure 10B:
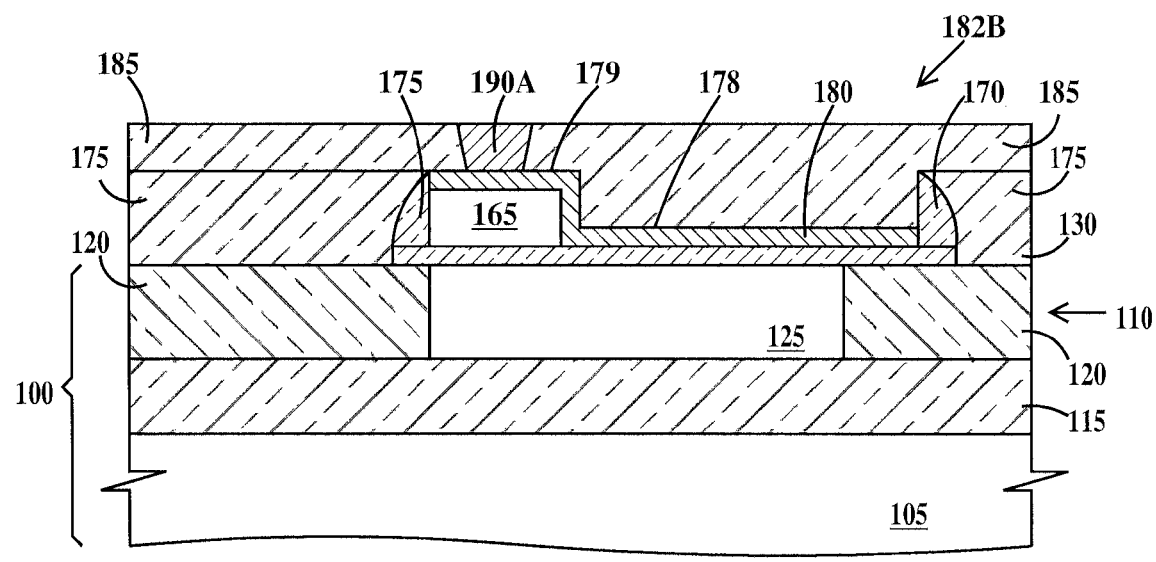

FIG. 10A is a top view and FIG. 10B is a cross-section through line 10B-10B of FIG. 11A of second alternative layout of an FET according to the first embodiment of the present invention. FIG. 10A is similar to FIG. 8B and FIG. 10B is similar to FIG. 8A except that raised gate electrode region 179 of an FET 182B is formed completely over body 125. This still results in reduced fringe capacitance compared to a conventional FET and allows a reduction is area of FET 182B compared to FET 182 of FIGS. 8A and 8B and FET 182A of FIGS. 9A and 9B.

Figure 11:
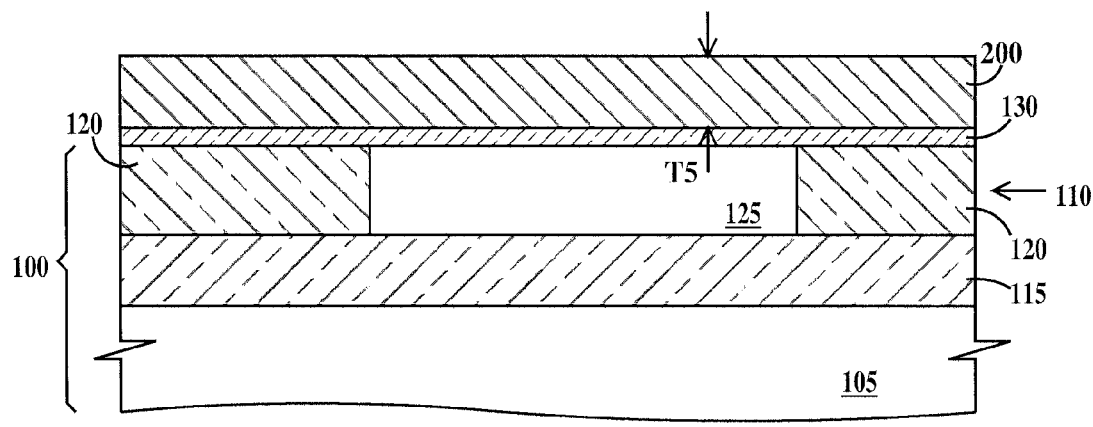
FIGS. 11 through 13 are cross-sectional drawings illustrating fabrication of an FET according to a second embodiment of the present invention.
Figure 12:
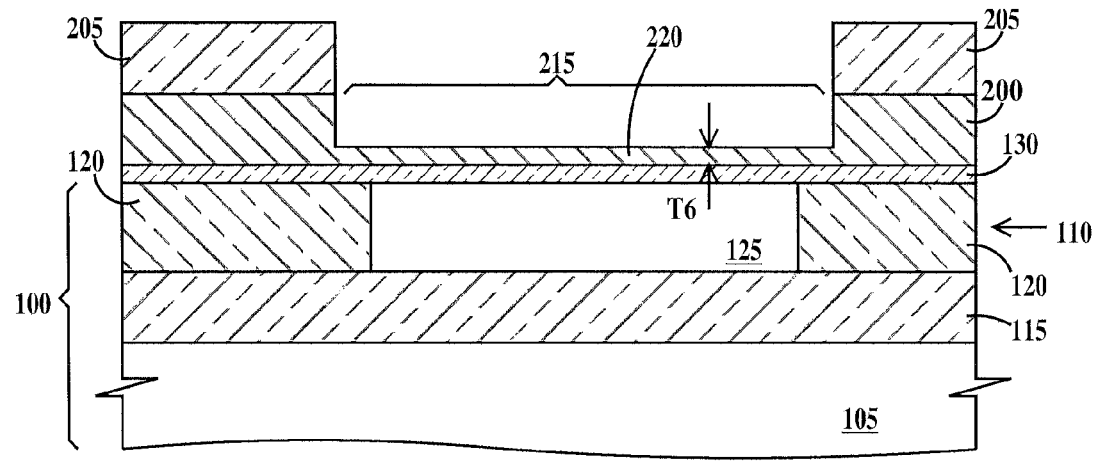
Figure 13:
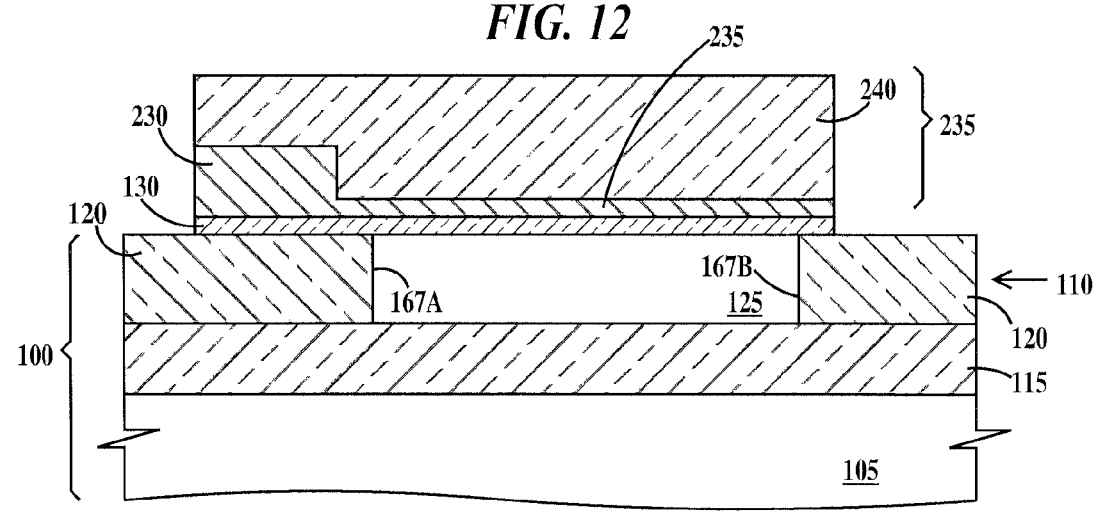

FIGS. 11 through 13 are cross-sectional drawings illustrating fabrication of an FET according to a second embodiment of the present invention. FIG. 11 is similar to FIG. 1 except polysilicon layer 135 of FIG. 1 is replaced with a metal layer 200 having a thickness T5. In one example, metal layer 200 comprises Al, Ti, W, Ta, TiN, or TaN.

In FIG. 12, a mask 205 is formed on top surface 215 of metal layer 200 and a trench 215 partially etched into the metal layer. A thus thinned region 220 of metal layer 200 has a thickness T6. Mask 205 may be a patterned photoresist layer formed by conventional photolithographic techniques well know in the art or may be a patterned hardmask layer formed by conventional photolithographic and etching techniques well know in the art.

Referring to FIGS. 11 and 12, in one example T5 is less than or equal to about 40 nm. In one example, T5 is less than or equal to about 20 nm. T5 is always greater than T6. In one example T5 is greater than or equal to about twice T6.

In FIG. 13, mask 205 of FIG. 11 is removed, a blanket dielectric layer deposited over metal layer 200, the blanket dielectric layer is masked (using conventional photolithography to form a patterned photoresist mask) and then the blanket dielectric layer and gate dielectric layer 130 are etched, where not protected by the photoresist mask, to define a gate electrode precursor structure 225 comprising a thick metal region 230, a thin metal region 235 and a dielectric mask 240. Gate electrode precursor structure 225 will define the lateral extents of the gate electrode of the FET being fabricated. Thin metal region 235 completely overlaps STI 120 over a first pair of opposite sidewalls (sidewalls 167A and 167B) of body 125 but does not completely overlap STI 120 over a second pair of opposite sidewalls of body 125 (not shown in FIG. 13). The first and second pairs of sidewalls are mutually perpendicular. Between each sidewall of the second pair of sidewalls and corresponding opposite sides of thin metal region 235 exist regions of body 125 are not covered by thin metal region 235 and dielectric layer 240. It is in these regions the source/drains of the FET being fabricated will be formed.

Next, source/drains are formed and metal silicide layers formed on the source/drains as described supra. Formation of sidewall spacers is optional.

Figure 14A:
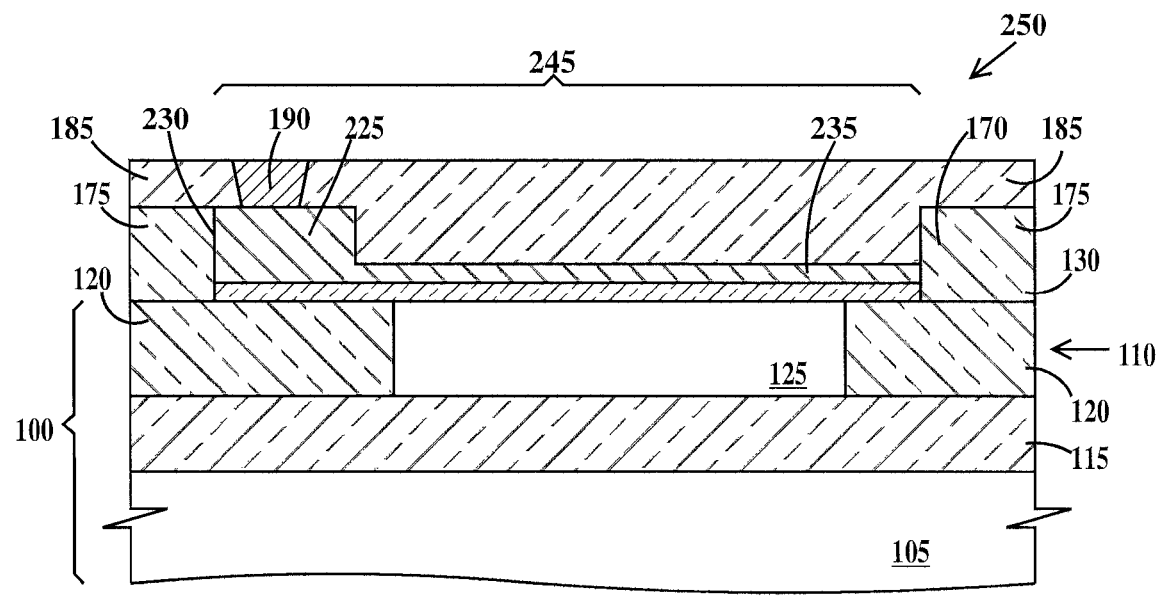
FIG. 14A is a cross-section through line 14A-14A of FIG. 14B, which is a top view of the FET of FIGS. 11 through 13 after a further fabrication step.
Figure 14B:
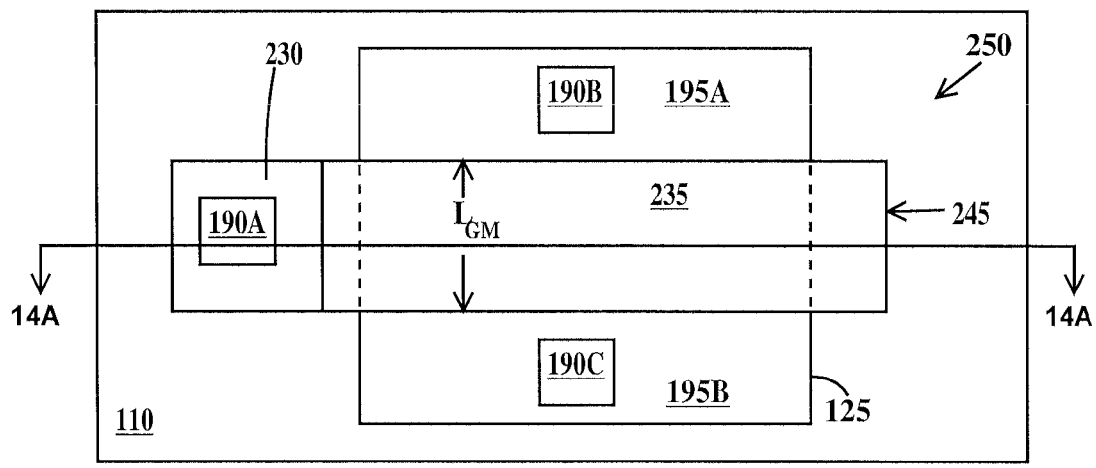

FIG. 14A is a cross-section through line 14A-14A of FIG. 14B, which is a top view of the FET of FIGS. 11 through 13 after a further fabrication step. In FIG. 14B, dielectric layers 175 and 185 are omitted for clarity. In FIGS. 14A and 14B dielectric layer 240 (see FIG. 13) has been removed to form a gate electrode 245 comprising thick metal region 230 and thin metal region 235. Dielectric layers 175 and 185 have been formed as well as contacts 190A, 190B and 190C to form a FET 250.

FET 250 thus fabricated has a gate channel length $L_{GM}$ defined by the width of gate electrode 245 between source/drains 195A and 195B. There is also a physical channel length $L_{PHYSICAL}$ that has been described supra. $L_{GM}$ is greater than or equal to $L_{PHYSICAL}$ and depends upon how far source/drains 195A and 195B extend under gate electrode 245. In one example, (referring back to FIGS. 11 and 12) T5 divided by $L_{GM}$ is less than or equal to 1. In one example, $L_{GM}$ is equal to or greater than about 4 times T5. In one example, (referring back to FIGS. 11 and 12) T5 divided by $L_{PHYSICAL}$ is less than or equal to 1. In one example, $L_{PHYSICAL}$ is equal to or greater than about 4 times T5.

The alternatives layouts illustrated in FIGS. 9A, 9B, 10A and 10B for the first embodiment of the present invention are equally applicable to the second embodiment of the present invention.

Thus, the embodiments of the present invention provide FET structures having reduced fringe capacitance.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating a field effect transistor, comprising:

forming a dielectric isolation along a perimeter of a region of a silicon layer to define a silicon body in said silicon layer;

forming a gate dielectric layer on said silicon body, a bottom surface of said gate dielectric layer in direct physical contact with a top surface of said silicon body; and forming an electrically conductive gate electrode on said gate dielectric layer, bottom surface of said gate electrode in direct physical contact with a top surface of said gate dielectric layer, said gate electrode having a first region having a first thickness and a second region having a second thickness, said first region extending along said top surface of said gate dielectric layer over said channel region, said second thickness greater than said first thickness; and wherein said forming said gate electrode includes:

forming a polysilicon layer on said top surface of said gate dielectric layer;

oxidizing a less than whole thickness of said polysilicon layer in a region of said polysilicon layer over said body to form an oxidized polysilicon layer;

after forming said source and said drain, removing said oxidized polysilicon layer to form said first region of said gate electrode; and simultaneously converting said first region of said gate electrode to a metal silicide layer and forming said metal silicide layer on exposed surfaces of said second region of said gate electrode.

2. The method of claim 1, wherein a top surface of said second region of said gate electrode is further away from said top surface of said gate dielectric layer than a top surface of said first region of said gate electrode is away from said top surface of said gate dielectric layer.

3. The method of claim 1, wherein said second region does not overlap said silicon body.

4. The method of claim 1, wherein said second region overlaps at least a region of said silicon body.

5. The method of claim 1, wherein said first thickness is less than or equal to about 50 nm.

6. The method of claim 1, wherein a channel length of said field effect transistor is defined by a width of said gate electrode between said source and said drain, and wherein said first thickness divided by said channel length is less than or equal to one.

7. The method of claim 1, wherein a channel length of said field effect transistor is defined by a width of said gate electrode between said source and said drain, and wherein said channel length is greater than or equal to four times said first thickness.

8. The method of claim 1, further including:
forming a gate electrode contact in direct physical and electrical contact only with said second region of said gate electrode.

9. A method of fabricating a field effect transistor, comprising:
forming a dielectric isolation along a perimeter of a region of a silicon layer to define a silicon body in said silicon layer;
forming a gate dielectric layer on said silicon body, a bottom surface of said gate dielectric layer in direct physical contact with a top surface of said silicon body; and
forming an electrically conductive gate electrode on said gate dielectric layer, bottom surface of said gate electrode in direct physical contact with a top surface of said gate dielectric layer, said gate electrode having a first region having a first thickness and a second region having a second thickness, said first region extending along said top surface of said gate dielectric layer over said channel region, said second thickness greater than said first thickness; and wherein said forming said gate electrode includes:
forming a metal layer on said top surface of said gate dielectric layer;
etching away a less than whole thickness of said metal layer in a region of said metal layer over said body to form said first region of said gate electrode;
forming a dielectric layer over said first region; and
after forming said source and said drain, removing said dielectric layer.

10. The method of claim 9, wherein a top surface of said second region of said gate electrode is further away from said top surface of said gate dielectric layer than a top surface of said first region of said gate electrode is away from said top surface of said gate dielectric layer.

11. The method of claim 9, wherein said second region does not overlap said silicon body.

12. The method of claim 9, wherein said second region overlaps at least a region of said silicon body.

13. The method of claim 9, wherein said first thickness is less than or equal to about 50 nm.

14. The method of claim 9, wherein a channel length of said field effect transistor is defined by a width of said gate electrode between said source and said drain, and wherein said first thickness divided by said channel length is less than or equal to one.

15. The method of claim 9, wherein a channel length of said field effect transistor is defined by a width of said gate electrode between said source and said drain, and wherein said channel length is greater than or equal to four times said first thickness.

16. The method of claim 9, further including:
forming a gate electrode contact in direct physical and electrical contact only with said second region of said gate electrode.

* * * * *